(12) United States Patent
Jones et al.

(10) Patent No.: US 6,526,361 B1
(45) Date of Patent: Feb. 25, 2003

(54) BATTERY TESTING AND CLASSIFICATION

(75) Inventors: Barbara L. Jones, Norfolk (GB); Paul Smith, Norfolk (GB); Jason Mark Clifton, Norfolk (GB)

(73) Assignee: Snap-on Equipment Limited, King's Lynn (GB)

( * ) Notice: Subject to any disclaimer, the term of this patent is extended or adjusted under 35 U.S.C. 154(b) by 0 days.

(21) Appl. No.: 09/445,669

(22) PCT Filed: Jun. 19, 1998

(86) PCT No.: PCT/GB98/01634

§ 371 (c)(1),
(2), (4) Date: Jul. 5, 2000

(87) PCT Pub. No.: WO98/58270

PCT Pub. Date: Dec. 23, 1998

(30) Foreign Application Priority Data

Jun. 19, 1997 (GB) ............................................. 9712888
Nov. 4, 1997 (GB) ............................................. 9723233

(51) Int. Cl.[7] ............................................. G01M 15/00
(52) U.S. Cl. ............................. 702/63; 702/57; 702/81; 702/108; 702/117; 702/182
(58) Field of Search ............................. 702/57, 58, 59, 702/63, 64, 65, 66, 67, 69, 81, 108, 117, 118, 122–124, 126, 182–185, 188, 189, FOR 103, FOR 104, FOR 105, FOR 106, FOR 110, FOR 111, FOR 134, FOR 135, FOR 155, FOR 170, FOR 171; 700/48, 95, 297; 706/16, 25; 340/636; 320/48, 132; 324/426, 429, 427, 430, 431, 433, 436; 701/29, 99, 101, 110, 111

(56) References Cited

U.S. PATENT DOCUMENTS 3,873,911 A * 3/1975 Champlin ................ 324/29.5
4,052,656 A * 10/1977 Lavell et al. ................ 320/23
4,193,025 A * 3/1980 Frailing et al. ............. 324/427
4,204,153 A 5/1980 Brown ........................ 324/429
4,322,685 A * 3/1982 Frailing et al. ............. 324/429

(List continued on next page.)

FOREIGN PATENT DOCUMENTS

| DE | 3343645 A1 | * | 6/1985 |
| DE | 4420122 A1 | * | 12/1995 |
| DE | 29902498 | * | 11/1999 |
| EP | 0146377 A1 | * | 6/1985 |
| EP | 0637754 | | 2/1995 |
| EP | 0762135 | | 3/1997 |
| EP | 0772056 | | 5/1997 |
| GB | 2278452 | | 11/1994 |
| GB | 2285317 | | 7/1995 |
| WO | 9605508 | | 2/1996 |
| WO | 9635522 | | 11/1996 |

OTHER PUBLICATIONS

IEE article, "Positive charging–health checks for batteries", Nov. 18, 1993, pp. 9–10.

Primary Examiner—Marc S. Hoff
Assistant Examiner—Carol S. W. Tsai
(74) Attorney, Agent, or Firm—Seyfarth Shaw

(57) ABSTRACT

Method and apparatus for battery evaluation and classification applies transient microcharge and/or microload pulses to an automotive battery. Classification is made on the basis of analysis of the resultant voltage profile or portions or dimensions thereof. In one embodiment the analysis utilizes a neural network or algorithm to assess a microcycle sequence of microload/microcharge tests utilizing one of a series of battery parameters including impedance as well as voltage characteristics to effect classification. Another embodiment adopts an optimized (not maximum) level of prior test-based data-training for a self-organizing neural network. A third embodiment utilizes prior test data correlation to enable algorithm-based classification without use of a neural network.

22 Claims, 14 Drawing Sheets

FIG. 8

U.S. PATENT DOCUMENTS

| | | | |
|---|---|---|---|
| 4,423,378 A | * 12/1983 | Marino et al. | 324/427 |
| 4,423,379 A | * 12/1983 | Jacobs et al. | 324/429 |
| 4,949,046 A | * 8/1990 | Seyfang | 324/427 |
| 5,092,343 A | * 3/1992 | Spitzer et al. | 128/733 |
| 5,256,957 A | * 10/1993 | Wiesspeiner | 320/20 |
| 5,280,792 A | * 1/1994 | Leong et al. | 128/702 |
| 5,284,719 A | * 2/1994 | Landau et al. | 429/50 |
| 5,303,330 A | * 4/1994 | Gersho et al. | 395/24 |
| 5,469,528 A | 11/1995 | Douglas et al. | 395/23 |
| 5,488,300 A | 1/1996 | Jamieson | 324/406 |
| 5,537,327 A | 7/1996 | Snow et al. | 364/483 |
| 5,584,291 A | * 12/1996 | Vapola et al. | 128/630 |
| 5,596,260 A | * 1/1997 | Moravec et al. | 320/30 |
| 5,608,309 A | * 3/1997 | Hikita et al. | 322/28 |
| 5,623,194 A | * 4/1997 | Boll et al. | 320/15 |
| 5,680,050 A | * 10/1997 | Kawai et al. | 324/427 |
| 5,736,831 A | * 4/1998 | Harrington | 320/9 |
| 5,809,490 A | * 9/1998 | Guiver et al. | 706/16 |
| 5,825,156 A | * 10/1998 | Patillon et al. | 320/21 |
| 5,864,237 A | * 1/1999 | Kawai et al. | 324/430 |
| 5,977,750 A | * 11/1999 | Ng et al. | 320/132 |
| 6,051,976 A | * 4/2000 | Bertness | 324/426 |
| 6,157,877 A | * 12/2000 | Jones et al. | 701/29 |
| 6,218,843 B1 | * 4/2001 | Zimmerman et al. | 324/426 |

* cited by examiner

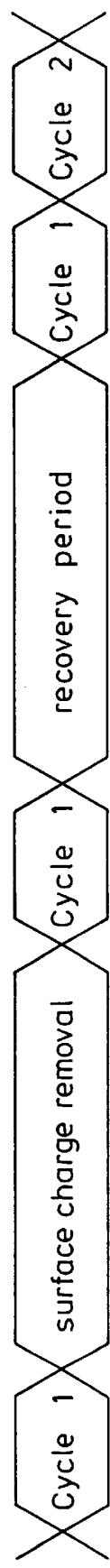
FIG. 1
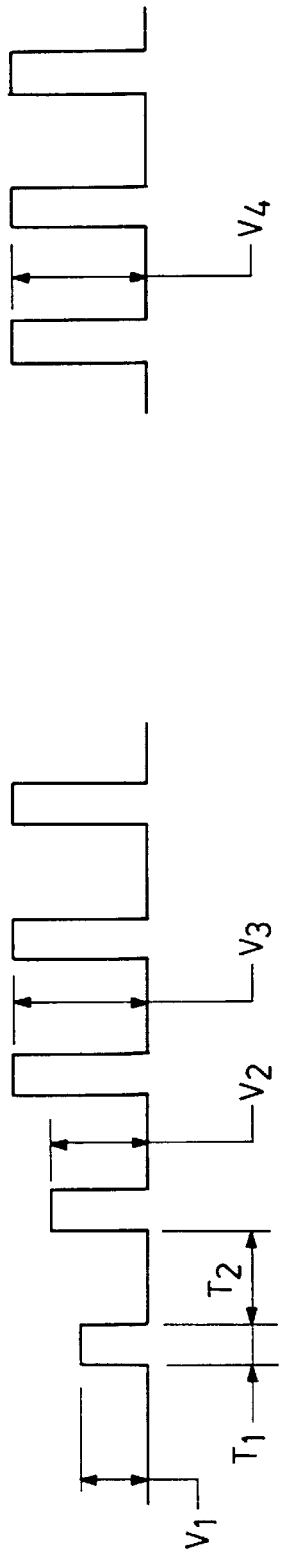
FIG. 2
FIG. 3

Worded Algorithm for Tester Including Hardware Considerations

Check tester power supply:-
    if tester power supply <8·3V
        then flash 'on' LED
        and end
    if tester power supply >8·3V
        then test Check battery terminal voltage:-
    light 'busy' LED
    if battery terminal voltage >12·4V
        then conduct microload test
            if drop under microload is between 0 and 2V
                then light 'good' LED
            if drop under microload is between 2 and 6V
                then light 'charge and retest' LED
            if drop under microload is >6V
                then light 'bad' LED
    if battery terminal voltage is between 11.8 and 12.4V
        then conduct microload test
            if drop under microload is between 0 and 2V
                then light 'good' LED
            if drop under microload is between 2 and 9V
                then light 'charge and retest' LED
            if drop under microload is >9V
                then light 'bad' LED
    if battery terminal voltage is between 10.5 and 11.8V
        then conduct microload test
            if drop under microload is between 0 and 2V
                then light 'charge and retest' LED
            if drop under microload is >2V
                then light 'bad' LED
    if battery terminal voltage is between 9.0 and 10.5V
        then conduct microload test
            if drop under microload is between 0 and 2.5V
                then light 'charge and retest' LED
            if drop under microload is >2.5V
                then light 'bad' LED
    if battery terminal voltage is between 0.1 and 9.0V
        then light 'bad' LED
        and end
    if battery terminal voltage is <0.1V
        then flash 'busy' LED
        and end
    terminate 'busy' LED
        and end

FIG. 14

BATTERY TESTING AND CLASSIFICATION

This invention relates to a method and apparatus for testing and classification of automotive and other batteries.

In the automotive industry and likewise in other technical areas, there is a need for improvements in systems for battery testing. We have provided an advance in the art in terms of the testing system disclosed in EP 0 762 135 A2 (case 12 reference P52759EP) which discloses a method and apparatus for testing automotive electronic control units and batteries utilising neural networks to effect waveform analysis on a digitised signal. Battery testing is by waveform analysis of the battery current during transient connection of a load. A network learning stage is employed together with a recognition test routine for characteristic waveforms. This approach is based upon software simulation of the waveform analysis which may be carried out visually by a person skilled in the art to distinguish between the current or voltage profiles of various categories of batteries.

References identified in searches made with respect to the subject matter of the present application consist of the following:
U.S. Pat. No. 4,204,153
U.S. Pat. No. 5,469,528
U.S. Pat. No. 5,537,327
WO 96/35522
WO 96/05508
GB 2285317A
GB 2278452A
None of these is any more pertinent than WO 96/35522 which discloses the use of a capacitor discharge pulse as a battery test step to enable identification of battery type by reference to voltage gradient using a voltmeter of oscilloscope or digital signal processing device whereby the battery type may be recognized prior to sorting discarded batteries for recycling purposes.

EPO 772056A discloses a system for checking the charge-discharge cycles of a rechargeable battery utilizing neural networks which are trainable by collecting data during discharge cycles of a battery. The battery is tested by collecting current battery data and using the neural networks for predicting from the current data a time interval by which the battery voltage will reach a predetermined critical threshold level.

U.S. Pat. No. 5,596,260 discloses a battery testing apparatus and method utilizing an algorithm to determine the charge of a battery. Initially, a battery state model is established comprised of a number of discrete charge states ranging from full charge to no charge. The probability of the actual battery's charge for a particular charge state is specified by the battery state model for each of the charge states. Then a discharge curve specifying the battery's voltage as a function of time is determined and calibrated. Then the battery's voltage is periodically measured, and based on the measured voltage and the discharge curve, a voltage probability distribution over the range of battery states is computed and the battery discharge model is updated to produce a discharge model having smaller variance. The charge of the battery corresponding to the mean value of the battery discharge model is then displayed to the user.

FIRST ASPECT

In a first aspect of the present invention we are seeking to provide a further technical advance in battery test systems whereby the approach of simulating the visual analysis carried out by a technical person is replaced by an alternative approach in which the technical attributes of computer systems are employed in a manner which exploits their inherent advantages rather than by seeking to constrain them to simulate a human analytical approach.

Accordingly, we have sought to utilise the capacity of software systems to process and analyse data relating to multiple parameters, in a way which the human brain finds difficult. In accordance with this approach, we realised that the multi-layer perceptron neural networks of our above-identified EP '135 A2 specification had limitations in terms of their requirement for the input of an approximation to the required analytical answer in any case.

In accordance with this new approach to battery analysis, we sought to provide a system in which multiple battery parameters, not all of them necessarily being electric parameters, such as thermal parameters, would be fed into the system and the system would be capable of recognising particular characteristics of the complex data fed in and thereby to effect an efficient classification step, perhaps on the basis of relatively limited data as compared with that required for waveform analysis.

An object of this aspect of the present invention is to provide a method and apparatus for classification of automotive and other batteries in accordance with one or more sensed parameters thereof, offering improvements in relation to one or more of the matters discussed above, or generally.

According to the invention there is provided a method of making battery test apparatus and there is also provided apparatus for classification of automotive and other batteries, as defined in the accompanying claims.

In an embodiment of the invention the system is provided with a neural network in the form of a self-organising network, namely a Kohonen network. In the embodiment, this software network has undergone (or is based upon software which has undergone) a controlled degree of training. That training is based on a data input comprising a representative sample of battery data. Such a representative sample of battery data comprises a plurality of battery parameters selected from the group including voltage, current, internal resistance, surface charge/capacitance, and thermal parameters. This controlled degree of self-training provides a basis for the classification step required from the self-organising network.

In the embodiment also, the method and apparatus provides test data generation means as part of the system and which is adapted to subject a given battery on test to test routines to generate test data for the classification means. This test data is related to the representative sample battery data on which the software network was trained. For example, the software network may be trained on data from a sequence of transient battery loads or transient battery charging routines, these being separated likewise by relatively transient intervals. Where such a routine has been included in the training data, then the test data generation means included in the battery test apparatus is arranged to generate corresponding data which leads to relatively efficient battery classification.

In connection with the use of multiple transient battery loads in the battery test routine, this approach has practical significance in relation to the capacitance aspects of battery construction, namely that the sequence of multiple transient loads is capable of discharging the surface charge of the battery which is present due to the parallel plate construction of the latter and which can otherwise provide misleading data arising from the (for example) 15 volts potential difference theron arising from alternator ripple.

The embodiments of the invention are software-intensive rather than hardware-intensive when compared with previously known battery testing systems.

SECOND ASPECT

In accordance with a second aspect of the invention, there is a need in the automotive and other industries for improved methods and apparatus for the testing and classification of batteries, notably the provision of systems which permit the in-situ testing of batteries using a minimum of hardware and making low power requirements while offering hand-held operational characteristics and relatively rapid test/classification results, and an object of this aspect of the present invention is to provide a method and apparatus offering improvements in relation to one or more of these requirements, or indeed generally.

According to the invention there is provided a method and apparatus for the testing and/or classification of automotive and other batteries as defined in the accompanying claims.

In an embodiment of the invention described below there is provided a method and apparatus in which a battery is subjected to a microcycle test procedure and the result of that procedure is subjected to analysis by a neural network or by an adaptive algorithm, and by means of this new approach to the testing of automotive and other batteries, we have established that it is possible to test and classify batteries in accordance with their life and other criteria in a manner which yields advantages in accordance with several of the factors discussed above.

In the embodiment, the data analysis step is performed by means of an adaptive algorithm or by a neural network, and the battery test procedure includes the application of transient stimuli as part of a microcycle. The hardware provided for this purpose is minimised by this design approach and the test connection to the battery allows testing in-situ without violating automotive radio code systems nor electronic control unit software and the like.

The battery test routine, including the microcycle, provides for the application of a series of transient stimuli to the battery in the manner shown in the accompanying drawings, for example:

Voltage test;
Microload;
Surface charge removal;
Microload;
Recovery;
Microload;
Microcharge.

Within a microcycle of the above kind there may be a series of positive or negative pulses applied to the battery, such being implemented by a field effect transistor (FET) gate.

By the use of a microcycle of transient charges and/or loads applied to a battery in sequence in accordance with this aspect of the invention there is provided the advantage (with respect to our above-mentioned EP '135A specification) that the practicality and cost-effectiveness of the system, particularly for use in a hand-held application, is unexpectedly advanced to an extent such that a relatively sophisticated analysis of a battery into the relevant one of a multiplicity of categories by use of an easily-operated hand-held item of equipment becomes a realistic option to an extent which is no hitherto the case.

The number of pulses provided in a microcycle is greater than one and generally anywhere in the range from 2 pulses to 100 or more. The voltages in the sequential pulses may be increasing or decreasing or equal. The number and frequency and voltage levels of the pulses may be determined by an initial voltage test applied to the battery, and/or ambient temperature and/or battery size, and then the pulse characteristics may be determined by data values obtained from subsequent pulses. In other words, the algorithm determining pulse numbers, frequency and levels is adaptive. Alternatively, prior knowledge relating to the battery can be used, at least in part, to set certain parameters of the pulse characteristics, these depending on such data as battery history, known behaviour etc.

In the embodiments of the invention in which the method and apparatus provides for battery testing and/or classification by use of a microcycle comprising two or more transient charges and/or loads applied to a battery in sequence, the use of such a testing routine is, to the best of the Applicant's knowledge, novel in relation to test procedures for automotive and like or other battery systems. Conventional test procedures have hitherto involved procedures which may be termed microcycles which necessarily (and often by intention) involve the use of substantial charge flows and associated energy release, with corresponding associated technical shortcomings including provision of heat sink or similar means, and utility limitations restricting testing to non in-situ battery evaluation.

The described embodiments employ an analysis step or stage for battery data generated from the microcycle, and the embodiments employ a neural network or an adaptive algorithm to enable classification or numerical evaluation of a battery. The use of a neural network leads to the data processing advantages setforth in our prior application of Jun. 19, 1997.

In the embodiments, FIGS. 11 and 12 of the drawings show battery responses to microload and microcharge cycles for both "good" and "bad" batteries.

Data employed in the analysis step of the invention is employed directly from the microcycle routine. Data may be in wave form format or in discreet datapoints format, and may represent relative or absolute values of the sampled battery characteristics. These latter may include impedance, bounce-back, peaks, areas, charge take-up, start and end voltages etc.

THIRD ASPECT

In accordance with a third aspect of the present invention there is provided a system in which the design approach of the first and second aspects of the invention is modified in order to achieve a substantial simplification in terms of hardware/software provision and analytical procedures, while still being based upon the same analytical principle, and thus being able to provide a comparable result in terms of battery classification into the principal classes. In simple terms this aspect of the invention provides a method and apparatus which is capable of achieving an accurate battery classification into, for example, the classes of bad/good but discharged/good classes, but with the above-mentioned structural and procedural simplification, with the attendant corresponding cost advantages.

In accordance with this aspect of the invention, we have discovered that in the method and apparatus of the preceding aspect of the invention there can be achieved the above-identified simplifications by the elimination of the use of neural networks for analysis of the profiles of the battery parameters for classification purposes.

This simplification and corresponding advance was a relatively unexpected development in the course of our research on this project, despite the background experience which our earlier work involving the use of neural networks provided. However, it was precisely the knowledge of the results of test procedures involving neural networks which provided the data whereby simplified methods and apparatus could be adopted.

More specifically, knowledge of the results of test procedures with neural networks enabled us to identify the fact that a satisfactory correlation could be achieved between battery classifications and test procedure profiles using a relatively simple algorithmic procedure. This procedure utilises previously-established data relating to microcharge and/or microload voltage profiles in order to define time intervals (from a defined time such as the microload or microcharge commencement time) at which to take characteristic sample voltages which thereby become substantially as informative as analysis of the entire profile itself.

Accordingly, according to this third aspect of the present invention there is provided a method and apparatus as defined in the identified ones of the accompanying claims.

In the embodiment described below, the battery's reaction to a transient test parameter applied to it provides a measure of the condition of the battery. By analysis of the waveform shape or profile (by reference to the corresponding voltage at a characteristic point) representative of the battery's reaction to the test parameter, the corresponding classification step can be effected. This analysis step is effected in the embodiment without employing a neural network by means of an algorithm adapted to identify a corresponding one of two or more battery condition classifications, and the corresponding one of these classifications exhibits a correlation with (voltage aspects of) the waveform profile of the electrical value.

In the embodiment, voltage aspects of the waveform profile utilised for this purpose include voltage values giving a measure of impedance, voltage bounce-back, voltage peaks, voltage troughs, voltage shape or profile, charge take-up, and start and end voltages.

Also in the embodiment, the transient period of the microload or microcharge applied to the battery lies in the range of 1 to 1,000 milliseconds, and the repetition interval between successive microloads and/or microcharges varies from 2 to 100 times the duration of application of the microload or microcharge.

In this aspect of the invention, the ability to eliminate the neural network with its attendant cost despite the retention of an analysis basis (relating to test parameter profile) corresponding to that carried out by the neural network, is of significant value and benefit. The achievement of this step by a relatively simple algorithmic hardware/based routine enables a valuable product simplification to be achieved.

Embodiments relating directly to a second aspect of the invention will now be described by way of example, with reference to the accompanying drawings in which:

FIG. 1 shows a series of testing procedures forming a complete test cycle;

FIG. 2 shows the profiles of voltage plotted against time for a microload test sequence;

FIG. 3 shows the corresponding profile for a microcharge test sequence;

Figure 13:
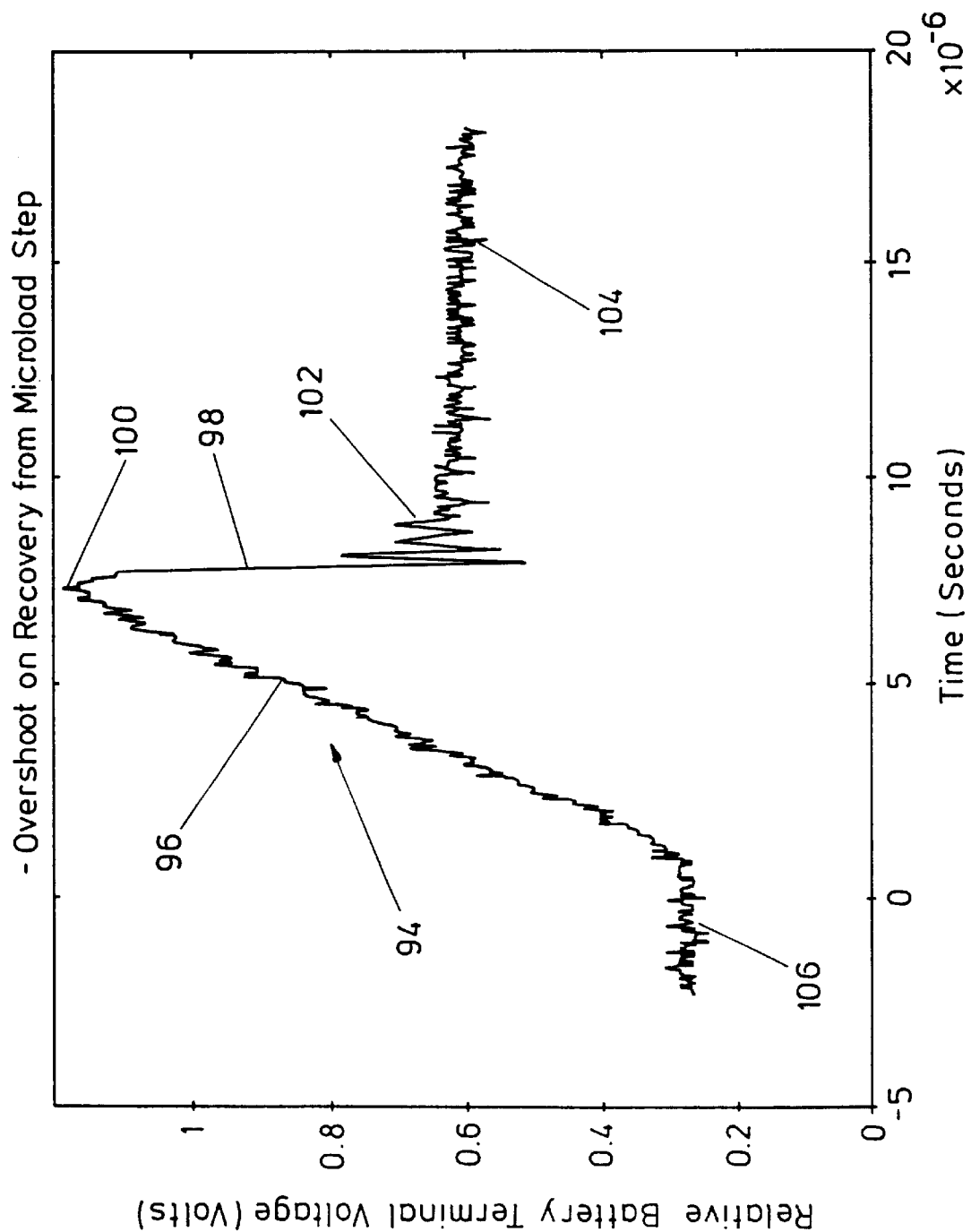
Figure 15:
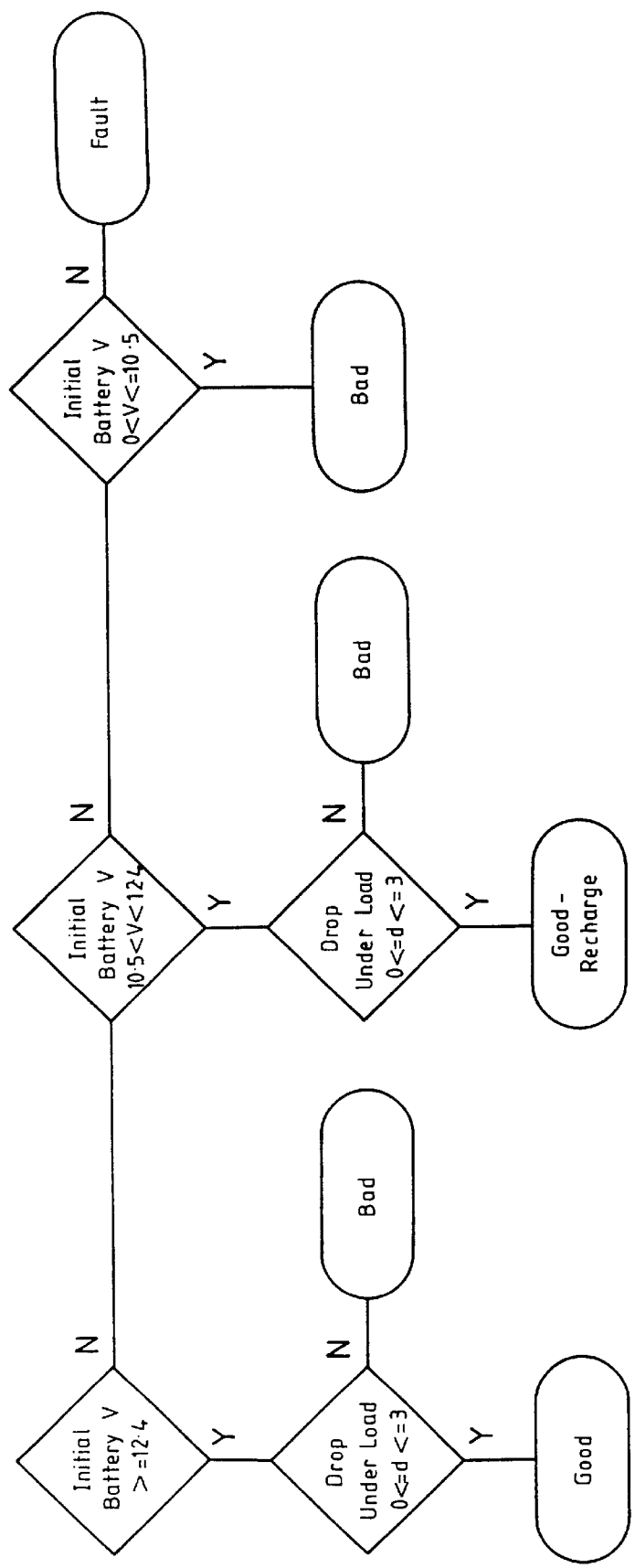
Figure 16A:
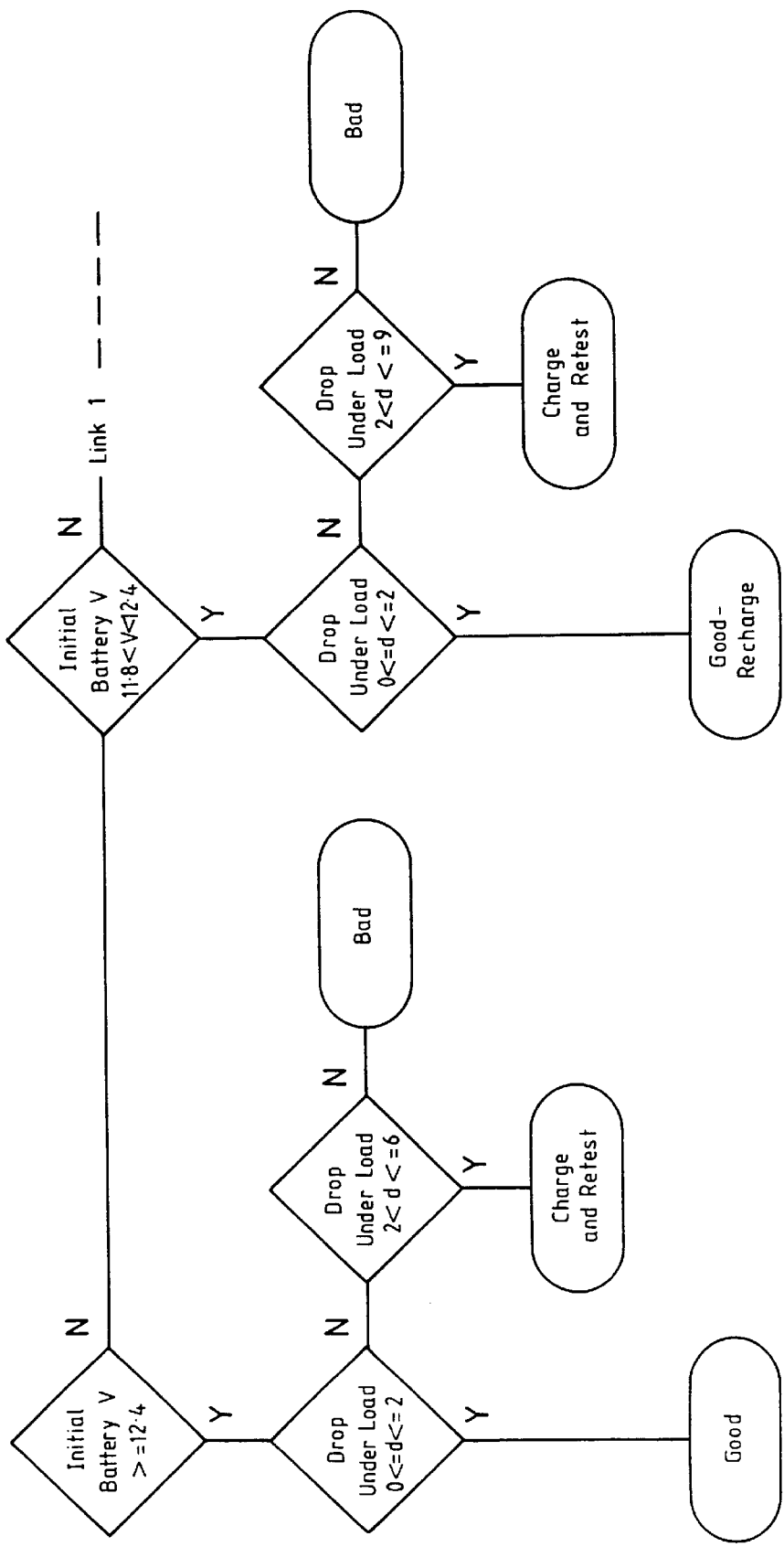
Figure 16B:
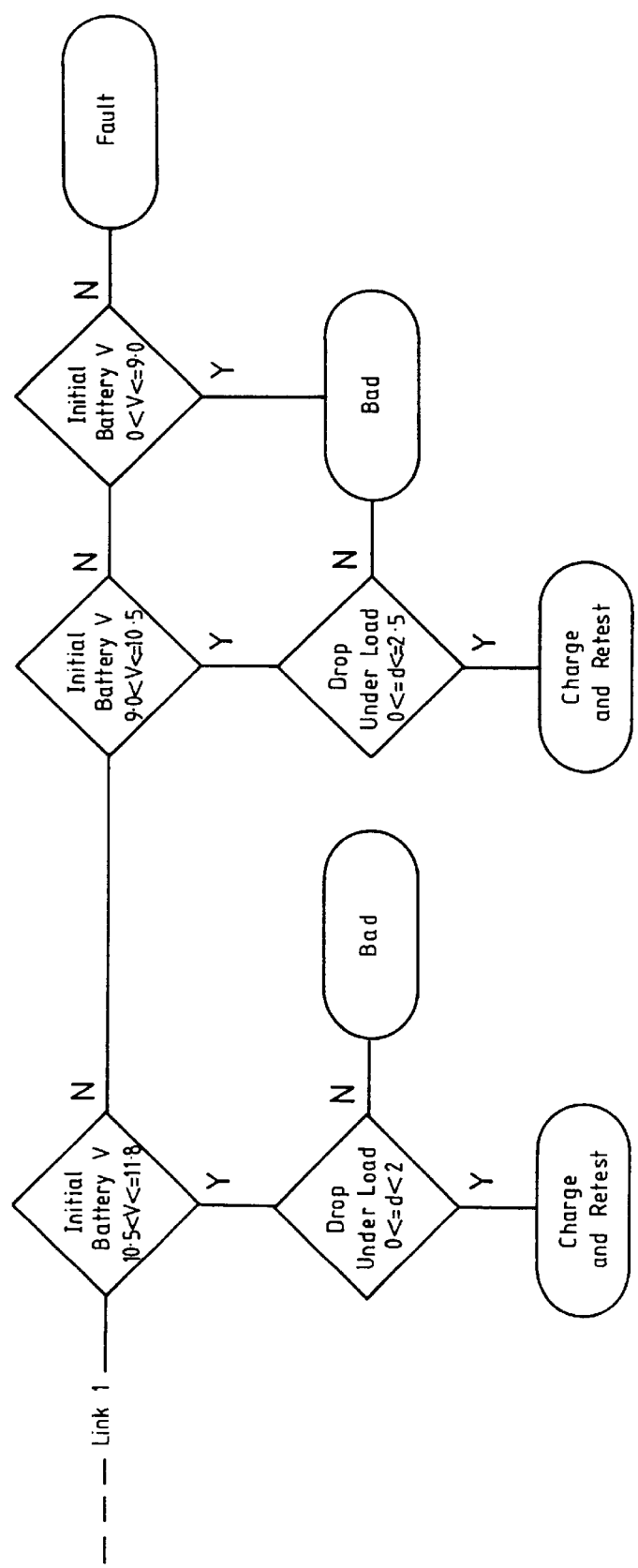

FIG. 13 shows a voltage/time plot for overshoot on recovery from a microloading step, which provides one of the classic analysable parameters for the purpose of the present invention; and FIGS. 14, 15, 16A and 16B show simple algorithms in text and flow diagram format for use in the third aspect of the invention to identify the relevant one of three and four battery categories without use of a neural network.

FIRST ASPECT

The embodiment of the invention will now be described for the purposes of technical disclosure of the present invention, and reference is directed to our own prior-published specification EP 0 762 135 A2 and we hereby incorporate the entire disclosure of that prior specification into the present application. The present embodiment is based upon the disclosure in the above EP '135A2 specification with the below-indicated modification. Equally, the embodiment may be based upon the description below (in relation to the second aspect of the invention) which is based upon FIGS. 1 to 8 of the accompanying drawings, and likewise utilising the below-described Kohonen network.

The embodiment of this aspect of the present invention uses a Kohonen Self-Organising Map in place of the Multi-Layer Perceptron network disclosed in our prior specification.

In place of the waveform analysis performed in our prior technique, the embodiment utilises readings during transient battery charge or discharge at certain predetermined time intervals. In test routines, in place of the 50 to 500 and preferably 150 to 300 milliseconds period for transient discharge (in EP'135 A2), the present embodiment has used periods in the range of up to 50 milliseconds, and preferably 10 to 20 milliseconds in order to avoid unacceptable heat dissipation. The apparatus includes test data generation means to subject a battery to a test routine based upon such transient loads or transient charge periods.

The Kohonen self-organising map is adapted to uncover natural groupings within data presented to its network and is capable of learning to respond to different parts of the data input signal. The network consists of neurons, which are initially given randomly assigned, "weight" vectors in preparation for the training routine. The neurons can be visualised as being arranged in a two-dimensional grid. The weight vectors are provided in the same format as the input signal. A neuron compares its current weight vector with the input signal's content and the number of matches made between these two vectors is the output of the neuron.

The neuron that responds most strongly to an input signal is identified and the neighbouring neurons around this neuron are identified and the weightings of these neurons are adjusted in order to give a stronger response to the relevant input signal. This weight adaptation process is known as the training process. We have discovered that over-training of the neurons leads to the network giving a positive response only to signals identical to those which it was trained on and this effect is clearly undesirable.

A network can be trained on more than one signal at once and a network can be trained to respond in other areas of its grid to input signals that are significantly different to a given one.

In the embodiments, data obtained during operation of a conventional battery tester and resulting from sampling at several predetermined intervals was then presented to a trained Kohonen self-organising network for analysis. By reference to the established data patterns, the network was able to classify the battery.

In the embodiment, the overall training data package consisted of some 550 battery tests, each comprising approximately 20 parameters. These parameters included a three phase test procedure including firstly surface charge removal, secondly charge test and thirdly heavy load test, which was followed by a recovery period. Other data provided to the network included Cold Cranking Amps ratings (CCA), and calculated battery internal resistance. This data block represented the basis for providing the Kohonen network with its requisite modest training data input requirements, for example a data sample of 60 battery tests chosen randomly from the above population and each test comprising 20 data samples for each battery state.

It is expected that it will be possible to cause the system to be capable of distinguishing between different modes of battery failure within the above-mentioned "bad-unserviceable" battery classification. Thus, for example, a battery may be regarded as worn out after a long length of service due to parasitic and gassing irreversible reactions, or the battery may have been damaged in some way. The differing electrical characteristics of such a battery may well be capable of classification by the Kohonen network.

In the embodiment, the classification output of the system provides a signal which is used for controlling a battery charging system responsive to the battery state. The classification signal is fed to a neural network controlling a battery charge rate system accordingly.

SECOND ASPECT

The second aspect of the invention provides a method and apparatus for battery testing and/or classification in which a microcycle of one or more transient charges and/or loads are applied to a battery in sequence and data relating to the battery reaction to the microcycle is analysed by a neural network or an adaptive algorithm to enable classification of the battery.

A further feature of the embodiment is that the analysis step is effected by the neural network or adaptive algorithm in relation to one or more of the following characteristics of the battery namely impedance, voltage bounce-back, voltage peaks, voltage troughs, voltage shape or profile, charge take-up and start and end voltages.

FIG. 1 shows the sequence of transient test cycles (cycle 1, cycle 2) with intervening periods of battery surface charge removal and battery recovery.

Figure 4:
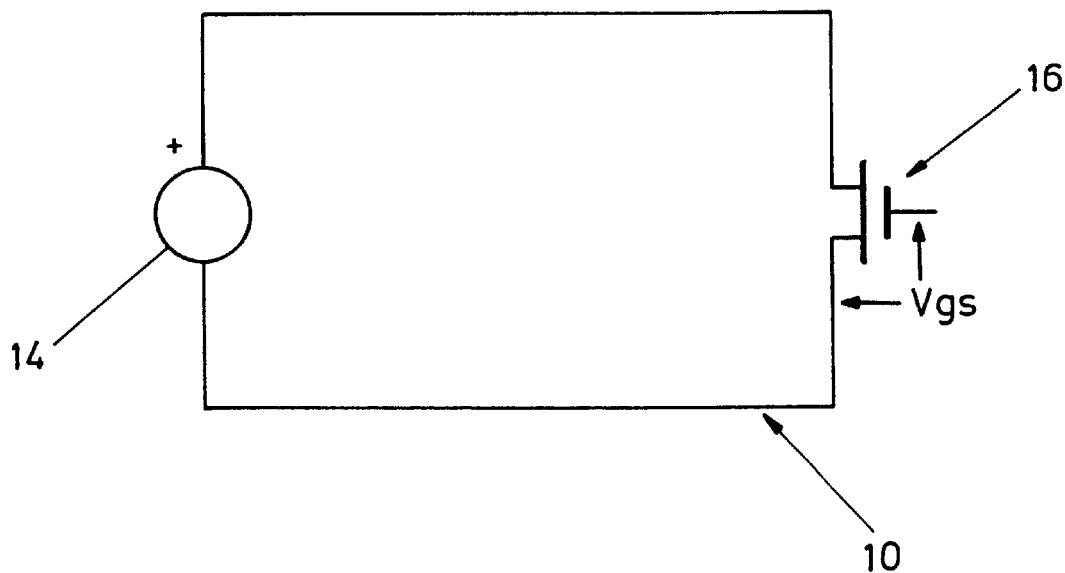
FIG. 4 shows a microload circuit diagram for transient load application to a battery on test.
Figure 5:
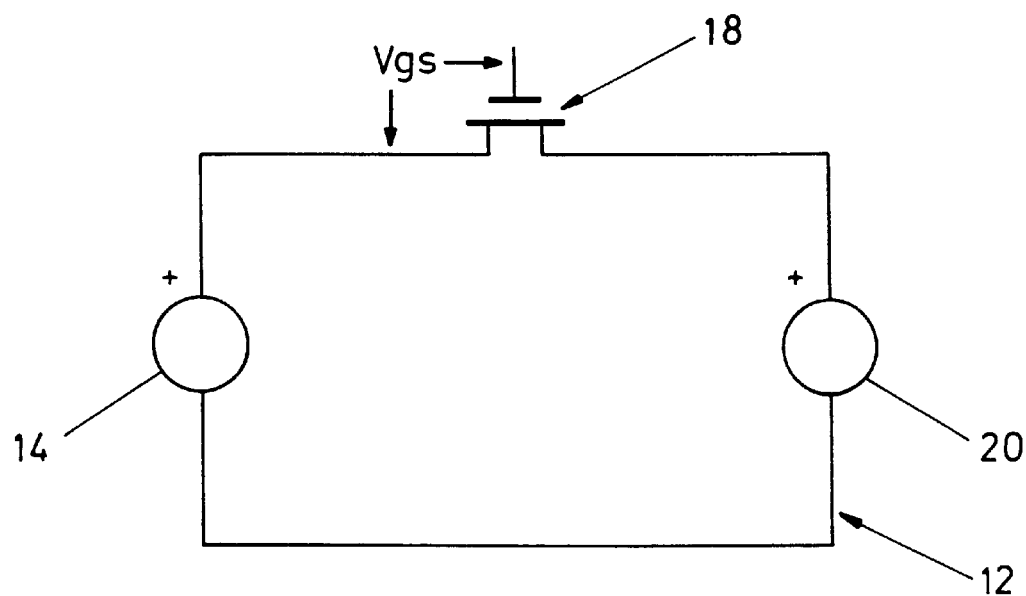
FIG. 5 shows the corresponding microcharge circuit diagram.

In FIGS. 2 and FIG. 3 the voltages applied to the field-effect transistors (FETS) in FIGS. 4 and 5 are shown.

As shown in the FIG. 2 microload sequence, the time ($T_2$) between successive microtests ($V_1$, $V_2$, $V_3$ etc) is greater than (or equal to) the duration ($T_1$) of each test. Voltage $V_1$ is less than $V_2$ is less than $V_3$. Overall test time (To) is greater than or equal to 40 seconds. For the microcharge cycle, the voltage ($V_4$) on the field effect transistor, is constant.

Figure 6:
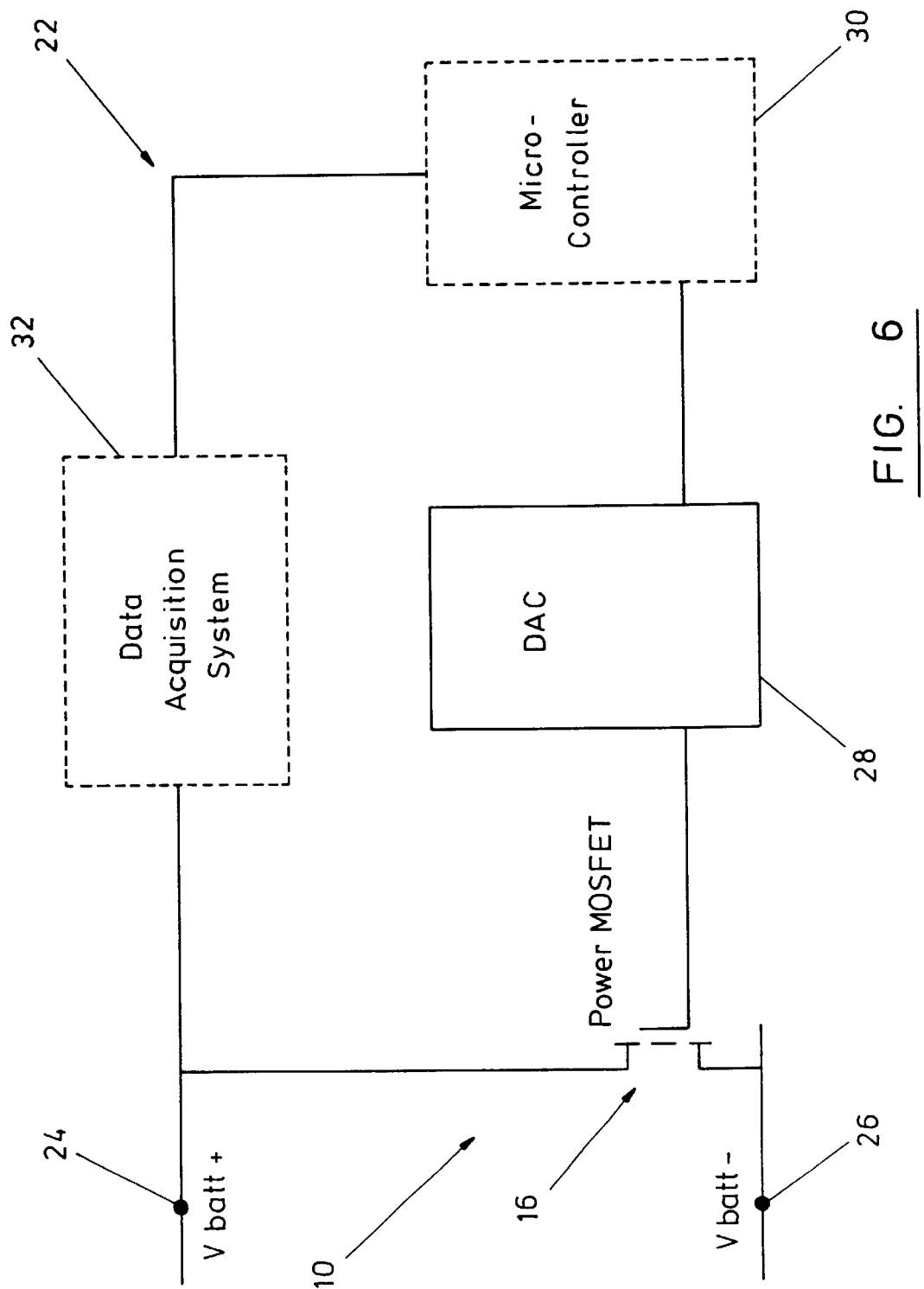
FIG. 6 shows the microload circuit together with the associated data acquisition and control systems.

FIGS. 4 and 5 show the FETs in the microload and microcharge circuits acting as switches for the application of the transient loads and charges under the control of a dynamic adjustment circuit seen in FIG. 6.

In the circuits 10 and 12 of FIGS. 4 and 5 the battery on the test is shown at 14 and the FETs at 16 and 18. The microcharge voltage source is shown at 20.

Turning now to the system 22 shown in FIG. 6, the microload circuit 10 is constructed generally as shown in FIG. 4 with battery terminals 24,26 connected to the power MOSFET field effect transistor switch 16 which is controlled by a dynamics adjustment circuit 28 which responds to a microcontroller 30. Data acquisition system 32 serves to provide an interface for data acquisition and transmission to the analysis function which forms part of microcontroller 30 and is shown in more detail in FIG. 8.

Generally, the power MOSFET applies a transient load to battery terminals 24,26 for a selected period in the range, for example of 20 to 100 microseconds. The reaction of the battery to this transient load and its recovery, are examined and analysed. Typical results are shown, for example, in FIG. 11.

The power MOSFET typically has a maximum size of 30 millimeters by 20 millimeters and its average current drawn is small and thus causes little damage to the vehicle battery. The current drain represented by the MOSFET can be altered by changing the gate voltage controlled by microcontroller 30 through adjustment circuit 28. The facility to vary the current drawn provides the basis for determining the internal impedance of the battery. In a similar way, other characteristics of the battery are readily derivable from the voltage profiles obtained in the method of the invention as described in the embodiments, including various aspects of voltage itself including voltage bounce-back, voltage peaks and troughs, charge take-up and start and end voltages. It is a feature of this aspect of the present invention that classification may be effected by a profile analysis in relation to one or more of these battery characteristics. In several instances of these, a measure of the magnitude of the relevant quantity is given by examination of one portion or dimension of the profile of the voltage trace produced during the test.

The use of transient microloads or microcharges in this embodiment eliminates the requirement of certain prior techniques for the use of large carbon piles, whereby the test apparatus of the embodiment can be in the format of a hand-held or otherwise mobile unit which can be battery-powered or powered from a simple domestic electricity supply.

An advantage of the microloading technique which we have discovered is that it is effective to remove surface charges from the battery, which otherwise adversely affect the accuracy of testing.

Figure 7:
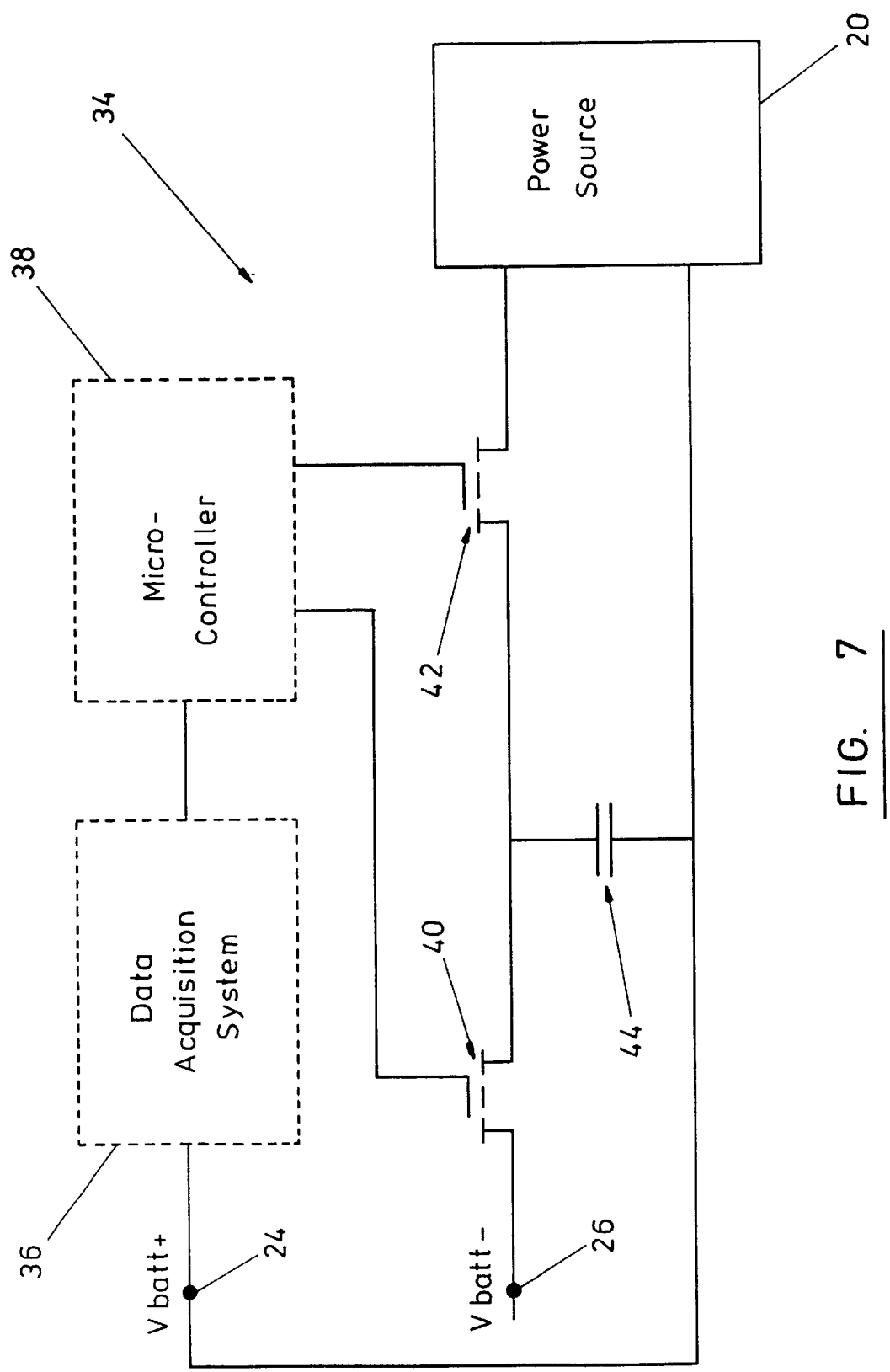
FIG. 7 shows the corresponding microcharge circuit corresponding to that of FIG. 6.

Turning now to the microcharge circuit 34 of FIG. 7, this differs somewhat from the simplified system shown in FIG. 5. Battery terminals 24, 26 are coupled to a data acquisition system 36 and a microcontroller 38. A pair of power MOSFETs 40,42 act as switches to permit the charging and discharging of a capacitor 44, which introduces a small packet of charge into the test battery via terminals 24, 26, very quickly, to provide transient battery-charging pulses.

The voltage source for the microcharges is identified (as in FIG. 5) at 20 and may be provided by battery charge stealing or a boost from a docking station.

Figure 12:
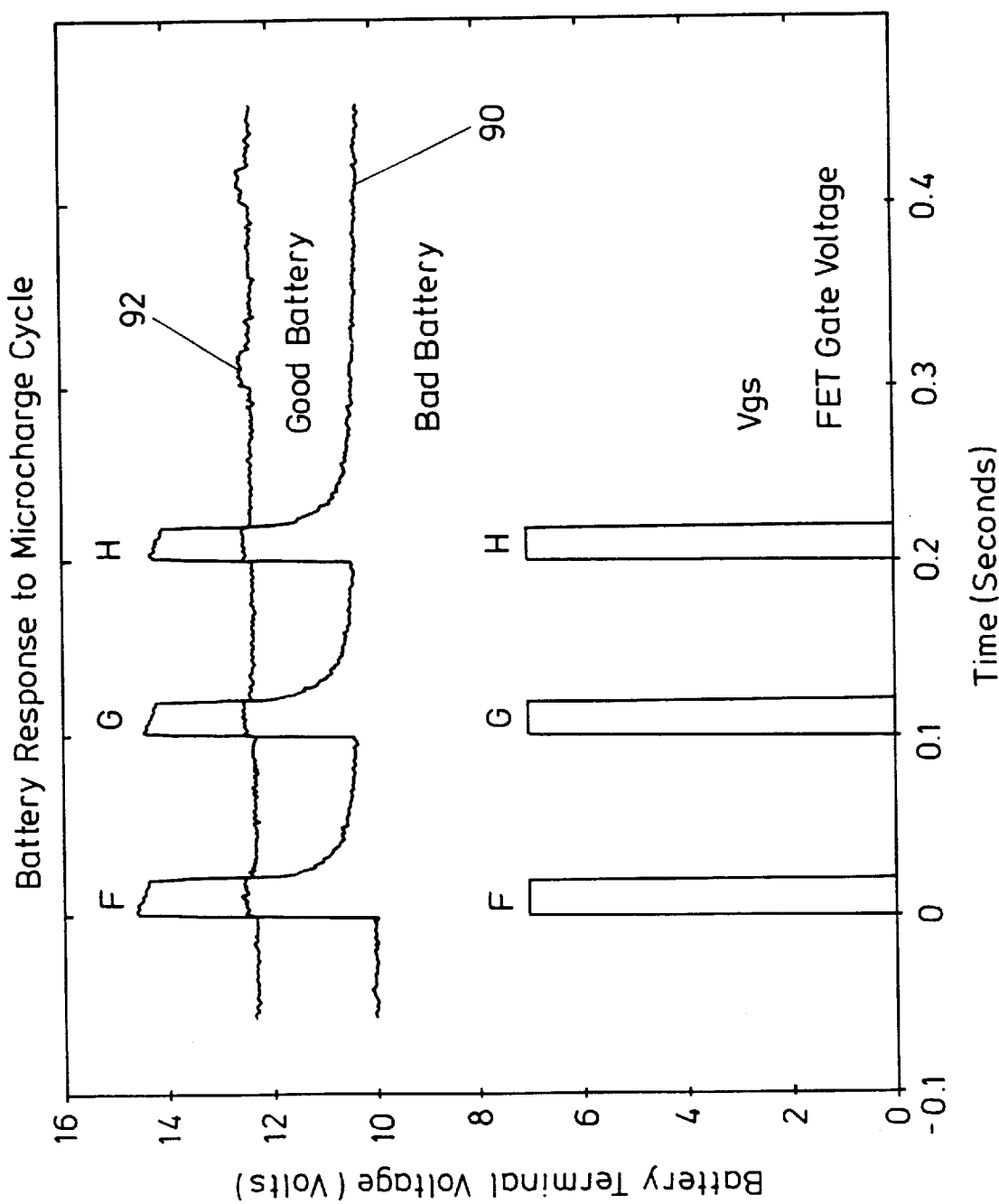
FIG. 12 shows the corresponding plots for a microcharge cycle with corresponding plots for good and bad batteries.

FIG. 12 shows examples of battery response to the microcharge cycle. The ease with which the battery accepts a charge pulse provides a measure of its condition, and likewise the battery's reaction after the pulse. Battery internal impedance and general battery condition are thus accessible by use of this technique. The method can however be combined with the microcharging method as a more effective overall means of battery testing, and a combined system is shown in FIG. 8.

Figure 8:
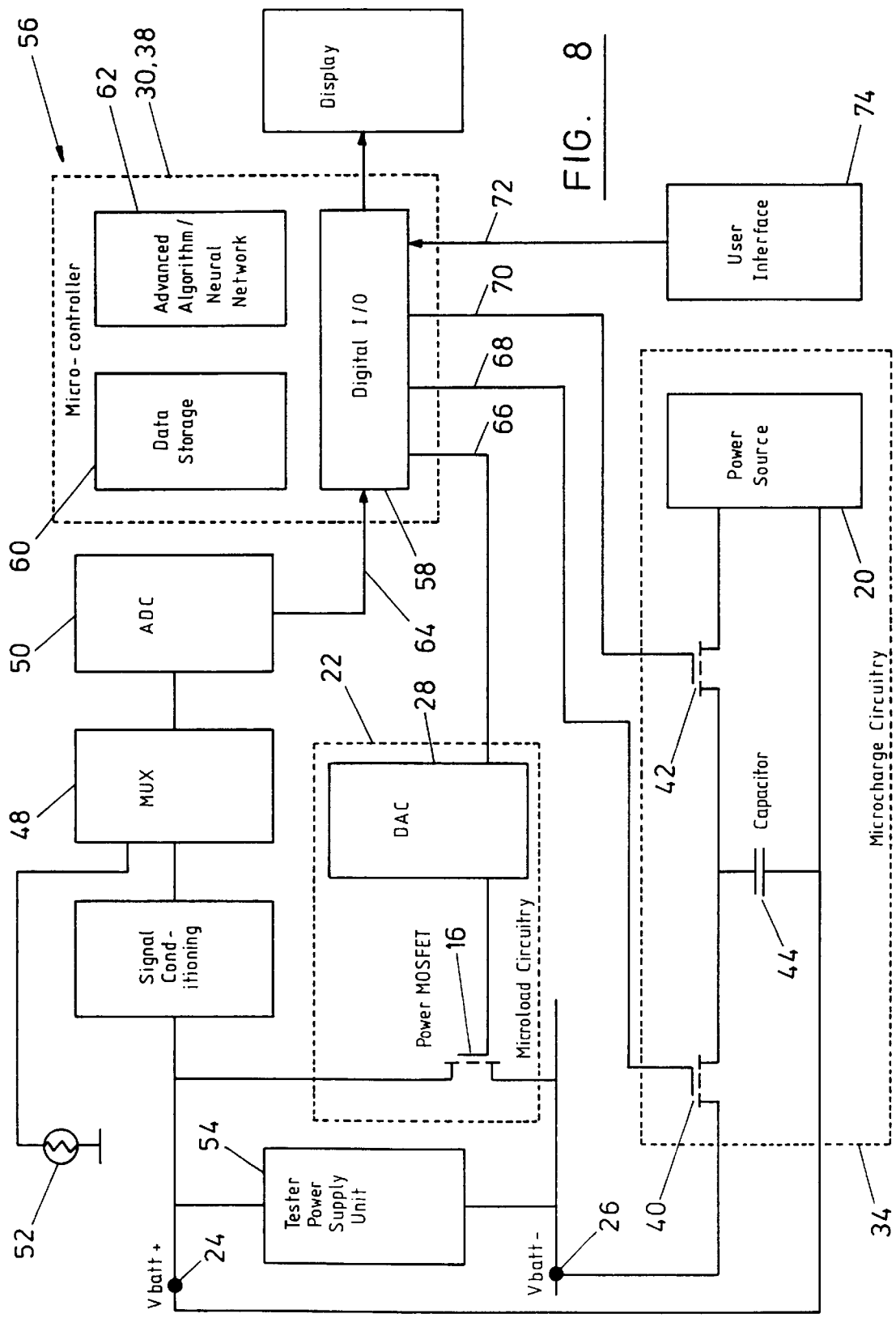
FIG. 8 shows a block circuit diagram for a comprehensive battery tester facility including microload and microcharge functions, a corresponding microcontrol system and a feed out to a display.

In FIG. 8, systems and components corresponding to those described above in relation to the preceding figures are numbered accordingly and will not be re-described except as necessary. Additional systems and components shown in FIG. 8 include signal-conditioning and multiplexing and analogue-to-digital circuits 46,48 and 50 respectively, of which multiplexer 48 is coupled to a temperature thermistor 52.

A power supply unit 54 based on, for example rechargeable batteries, provides a compact source of power for the portable system 56 as a whole, of FIG. 8.

The micro-controller identified at 30,38 (for correlation with the micro-controllers of the previously-described circuits) incorporates a digital interface unit 58, a data storage function 60 and an algorithmic function 62 providing the stepwise analytical function for the electrical parameter inputs received by interface 58 at 64,66,68 and 70.

A further connection 72 to interface 58 provides a user input and control function from a keyboard or other control input device 74. A display device 76 provides direct indication of the recognised battery category, providing a direct indication of the relevant one selected on the basis of the waveform resulting from the analysis of the microcharge/microload sequence applied to the battery.

The analysis function is indicated at 62, being provided by an advanced or adaptive algorithm, or a neural network, in this embodiment.

By the use of a microcycle of transient charges and/or loads applied to a battery in sequence in accordance with this aspect of the invention there is provided the advantage (with respect to our above-mentioned EP '135A specification) that the practicality and cost-effectiveness of the system, particularly for use in a hand-held application, is unexpectedly advanced to an extent such that a relatively sophisticated analysis of a battery into the relevant one of a multiplicity of categories by use of an easily-operated hand-held item of equipment becomes a realistic option to an extent which has not hitherto been the case.

Data storage function 60 cooperates with the algorithmic/neural network function 62 in enabling a correlation of waveform and battery condition categories within the analysis sub-system 30, 38. Implementation may be effected on a compatible PC system or custom hardware providing the required digital signal processing functions, for example as available from Texas Instruments as noted in the EP '135 A2 specification mentioned above. Information mentioned on algorithms for the purpose is available in the publication "neural networks in C++" by Adam Blum, published by John Wiley & Sons. Simplified algorithms as used in the third aspect of the invention are shown in FIGS. 14, 15, 16a and 16b in text and flow diagram format.

Figure 9:
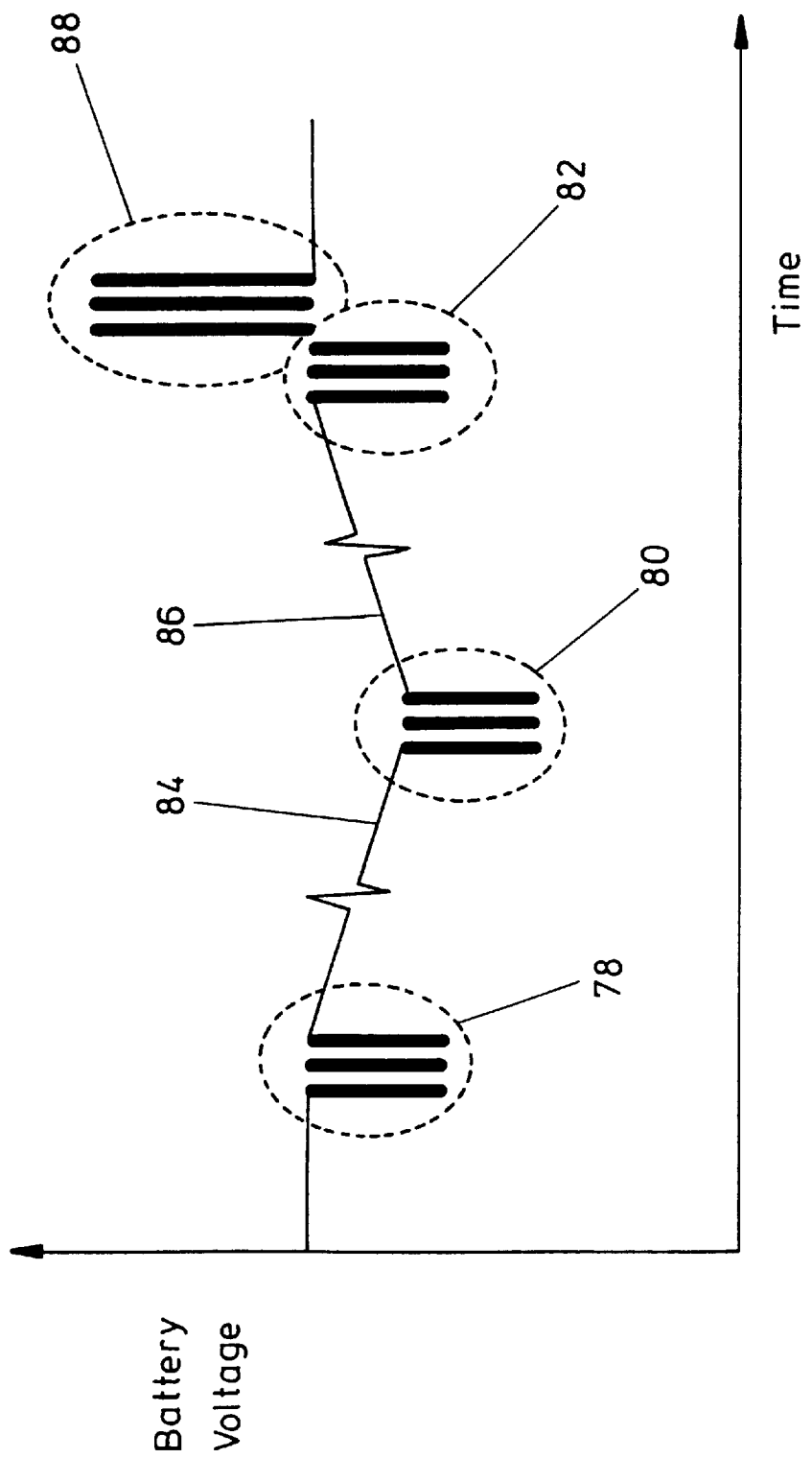
FIG. 9 shows a plot for the results of a complete battery test cycle showing the voltage/time profile with identification of the surface charge removal and recovery period steps.

FIG. 9 illustrates results obtainable with the system of FIG. 8 for a complete battery test cycle.

FIG. 9 is a voltage/time plot illustrating a cycle of three transient microloads 78,80,82 separated by two recovery periods 84,86, followed by a transient microcharge 88.

The voltage slope between the transient test steps indicate changes including battery surface charge removal at 84 between the first two microloads. The time interval between the test steps is indicated on a linear scale by the location of the relevant traces on that scale, the microcharge step 88 following closely on the third microload.

Figure 10:
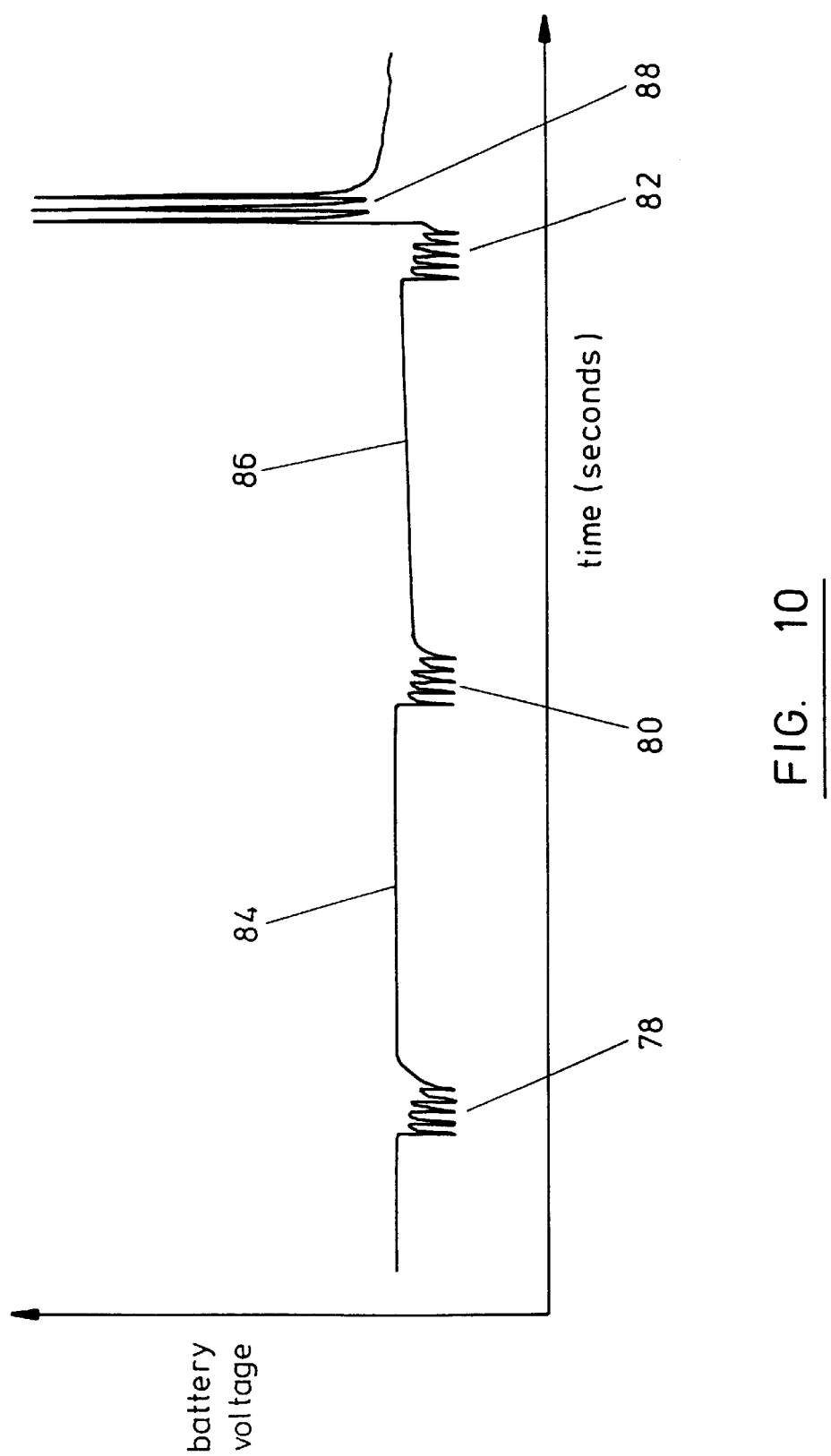
FIG. 10 shows a battery voltage/time plot for a typical response to a complete test cycle for an "average" battery.

FIG. 10 shows, in a voltage/time plot, the actual results obtained for a battery in "average" condition. The four microload/charge steps are indicated by the same reference numerals as in FIG. 9. The profiles are characteristic of the battery classification, and taken in combination with the actual values of the pre- and post-test voltages detected provide a characteristic means for identifying the specific classification which is applicable.

Figure 11:
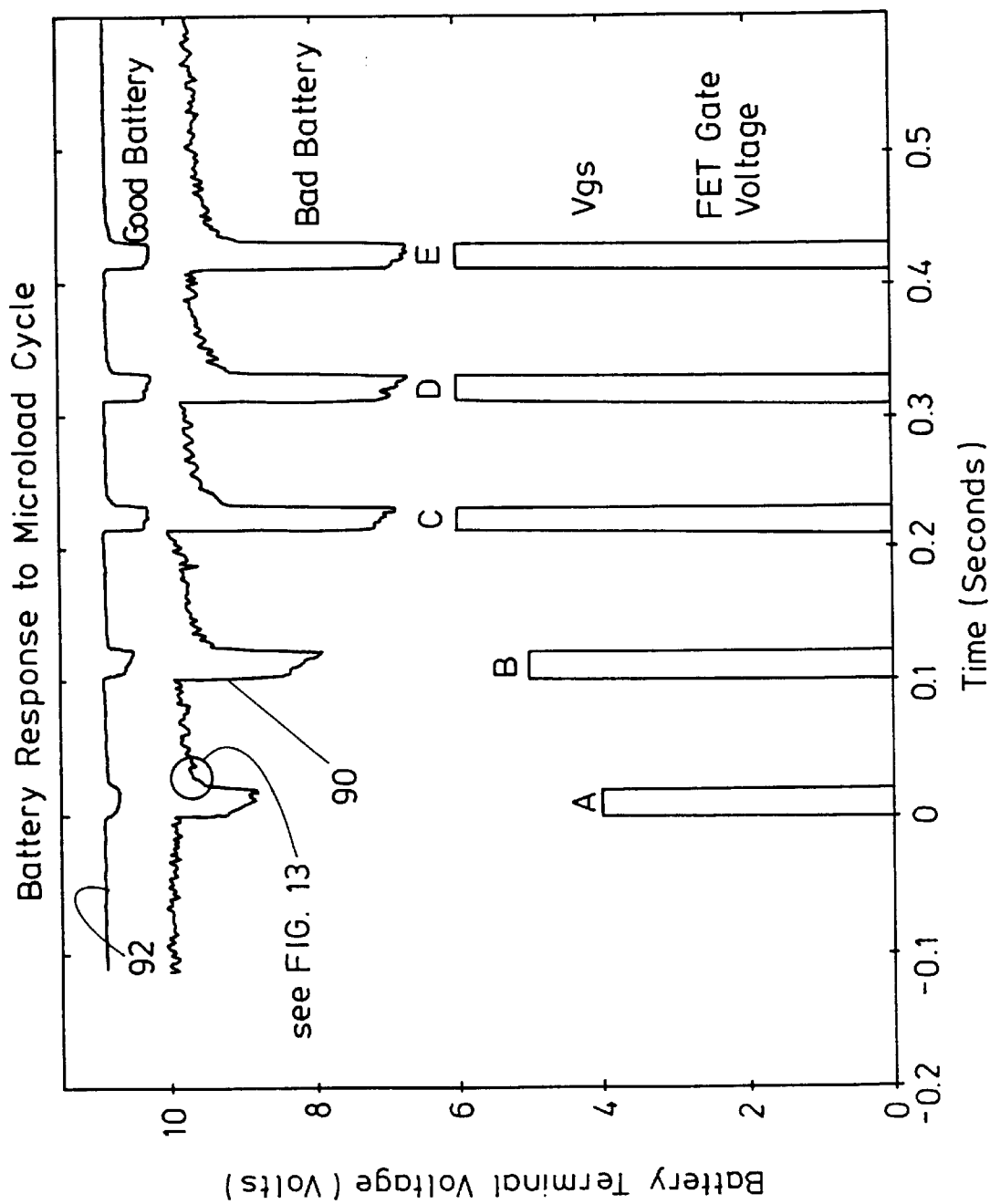
FIG. 11 shows a battery terminal voltage/time plot in a microload cycle with indication of the individual microloads applied by the FET and the corresponding voltage drops, both for a good battery and for a bad battery.

Turning now to the graphic data shown in FIGS. 11 and 12, these show the voltage/time plots for not only the FET gate or control voltages, but also the battery responses for good and bad batteries. FIG. 11 shows the microload result and FIG. 12 shows the microcharge result.

FIG. 11 shows the effect of 5 microload cycles, these being accomplished within somewhat under 0.45 seconds (for all 5) with intermediate recovery periods of approximately three quarters of 0.1 seconds ie 0.075 seconds. Each individual load transient has a duration of approximately one quarter of 0.1 seconds ie 0.025 seconds.

The gate voltages for the tests show an increase from about 4 volts to about 6 volts from tests A to C and then remain constant. The corresponding five voltage drops for the plot 90 of a bad battery show characteristic significant drops at A and B with corresponding relatively steady-state profiles at C, D and E of which the amplitude and saw tooth profiles are characteristic.

In the plot 92 of a corresponding good battery the substantially reduced voltage dips and the correspondingly modified profiles of the dip and intermediate voltages provide the clear basis for a corresponding classification accordingly.

In FIG. 12 which corresponds to FIG. 11 but shows a sequence of three microcharge cycles or steps labelled F, G and H, the indications of the microcharge parameters in terms of the FET gate voltages and transient time intervals correspond very much to those of FIG. 11 and therefore require no further comment.

The battery responses in FIG. 12 for bad battery 90 and good battery 92 are readily distinguished in terms of the markedly enhanced resultant battery voltage step-up in the case of bad battery 90, as against the corresponding modest or almost negligible voltage shift for good battery 92.

FIG. 13 shows, on a much shorter time scale, the voltage/time plot during the short recovery period following a microload step.

It can be seen that the overshoot profile 94 has a well-defined saw-tooth rising profile on its leading edge 96. This is followed by a relatively uncharacterised and more steeply graded trailing edge 98 from peak 100, followed by an oscillating profile at 102 before the voltage settles down to the level 104 corresponding to the recovery from the microload level 106. It will be understood that such a profile provides a basis for clear battery classification separation caused by profile changes in the several identified areas resulting from battery state differences of the kind which are apparent from FIGS. 11 and 12.

THIRD ASPECT

This embodiment represents a simplification of the embodiment described above (second aspect) in which the neural network/advanced algorithm 62 of the data-analysing microcontroller 30,38 is replaced by a relatively simple algorithm which is adapted to identify a particular one of two or more battery conditions classifications exhibiting a correlation with the waveform profile resulting from the microcharge or microload steps discussed above in relation to the preceding embodiments. For this purpose, this embodiment examines voltage levels at characteristic (previously determined) points on the microload or microcharge voltage profile by reference to the time interval from commencement of the test.

Illustrative algorithms for the purpose of identifying the relevant one of three or four battery categories are set out in FIGS. 14, 15, 16A and 16B and represent relatively undeveloped stages in the algorithms' technical development in relating detected voltage parameters to battery condition categories.

Specifically, on the basis of the data storage function 60 comprising the results of tests on batteries in the relevant limited number of categories or classifications applicable to this simplified apparatus, we have found that a reliable level of acceptably accurate classification can be achieved without the sophistication and attendant cost inherent in the use of neural networks, nor even is it necessary to employ the advance/adaptive algorithms designated for the embodiment of FIG. 8. Operation of this simple embodiment proceeds generally in accordance with matters described above, but with the simplification represented by use of a reduced number of battery categories such as simply "good/good discharged/bad."

What is claimed is:

1. A method for determining the condition/classification of automotive and other batteries in accordance with one or more sensed parameters thereof comprising the steps of:
    a) applying a transient electrical test parameter to the terminals of a battery to be tested for no more than one second;
    b) utilising a characteristic of the battery's reaction to said test parameter as a basis for said determination;
    c) said method further comprising the step of utilising the battery's reaction to said transient test parameter to provide a measure of the condition of said battery by analysis of the waveform shape or profile of an electrical value representative of the battery's reaction to said test parameter;
characterised by
    d) the step of analysis of the waveform profile of said electrical value of the battery's reaction to said test parameter being effected without employing a neural network but by means of an algorithm adapted to identify a corresponding one of two or more battery condition classifications, and said corresponding one classification exhibiting a correlation with time-defined voltage aspects of said waveform profile of said electrical value.

2. A method according to claim 1 characterised by said electrical value representative of said battery's reaction to said transient test parameter comprising one or more of the following characteristics, namely impedance, voltage bounce-back, voltage peaks, voltage troughs, voltage shape or profile, charge take-up, and start and end voltages.

3. A method according to claim 1 characterised by said analysis step being adapted to relate the value of said electrical value to two or more ranges of such values which are representative of two or more corresponding condition classifications of such battery.

4. A method according to claim 1 characterised by said transient test parameter being applied for from one to one hundred milliseconds.

5. A method according to claim 1 characterised by said transient test parameter being repeated at intervals of from 2 to 100 times the duration of said test parameter itself.

6. Apparatus for determining the condition/classification of automotive and other batteries in accordance with one or more sensed parameters thereof comprising:
    a) means for applying a transient electrical test parameter to the terminals of a battery to be tested for no more than one second;
    b) analysis means adapted to utilise a characteristic of the battery's reaction to said test parameter as a basis for said determination;
    c) said analysis means being adapted to utilise the battery's reaction to said transient test parameter to provide a measure of the condition of said battery by analysis of the waveform shape or profile of an electrical value representative of the battery's reaction to said test parameter;
characterised by;
    d) said analysis means not comprising a neural network and being adapted to effect said analysis by means of an algorithm adapted to identify a corresponding one of two or more battery condition classifications, of which said one classification exhibits a correlation with time-defined voltage aspects of the waveform profile of said electrical value.

7. Apparatus according to claim 6 characterised by said analysis means being adapted to effect said analysis by reference to one or more of the following battery characteristics namely impendence, voltage bounce-back, voltage peaks, voltage troughs, voltage shape or profile, charge take-up and start and end voltages.

8. Apparatus according to claim 6 characterised by said analysis means being adapted to relate the value of said electrical value to two or more ranges of said values which are representative of a corresponding two or more battery condition classifications.

9. Apparatus according to claim 6 characterised by said apparatus being adapted to apply said transient test parameter for from 1 to 100 milliseconds.

10. Apparatus according to claim 6 characterised by said apparatus being adapted to repeat said transient test parameter at intervals from 2 to 100 times the duration of said test parameter.

11. A method of making battery test apparatus for classification of automotive and other batteries in accordance with one or more sensed parameters thereof, the method comprising:
    a) providing data input coupling means adapted to couple a battery to data classification means;
    b) providing said data classification means to be coupled by said coupling means to said battery so that said battery provides a data source permitting classification of said battery's state;
    c) said classification means being provided comprising a neural network and said neural network being adapted to carry out a classification step on said data accordingly;
characterised by;
    d) providing said neural network in the form of a self-organising software network;

e) said method further comprising causing said self-organising software network to undergo (or be based upon software which has undergone) a controlled degree of training thereof based on an input comprising a representative sample of battery data, said representative sample of battery data comprising a plurality of battery parameters and selected from the group including voltage, current, internal resistance, surface charge/capacitance and thermal parameters; and f) said method further comprising providing said battery test apparatus with test data generation means adapted to subject a given battery on test to test routines to generate test data for said classification means through said coupling means, which test data is related to said representative sample of battery data on which said software network was trained, whereby said test data may be readily classified by said data classification means, the test routines including applying plural transient loads or plural transient charges to a battery in sequence, each transient load or charge having a duration of no more than one second.

12. A method according to claim 11 characterised by employing as said neural network a Kohonen self-organising software network.

13. A method according to claim 11 characterised by employing said self-organising network to identify groupings of data within said data from said battery.

14. A method according to claim 11 characterised by causing said neural network to identify groupings of data within said data from said battery.

15. Apparatus for classification of automotive and other batteries in accordance with one or more sensed electrical parameters thereof, said apparatus comprising;

a) data input coupling means adapted to couple a battery to data classification means;

b) data classification means adapted to be coupled by said coupling means to a battery so that said battery provides a data source permitting classification of said battery's state;

c) said classification means comprising a neural network adapted to carry out a classification step on said battery data accordingly;

characterised by;

d) said neural network comprising a self-organising software network;

e) said self-organising network having undergone (or being based upon software which has undergone) a controlled degree of training based on data input comprising a representative sample of battery data, said representative sample of battery data comprising a plurality of battery parameters selected from the group including voltage, current, internal resistance, surface charge/capacitance and thermal parameters, said data providing a basis for the classification step required from said self-organising network; and f) said apparatus further comprising test data generation means adapted to subject a given battery on test to test routines to generate test data for said classification means through said coupling means, which test data is related to said representative sample of battery data on which said software network was trained, whereby said test data may be readily classified by said data classification means, the test routines including applying plural transient loads or plural transient charges to a battery in sequence, each transient load or charge having a duration of no more than one second.

16. Apparatus according to claim 15 characterised by said neural network comprising a Kohonen self-organising network.

17. Apparatus according to claim 15 characterised by said self-organising network being adapted to identify groupings of data within said data from said battery.

18. Apparatus according to claim 15 characterised by said classifying means being adapted to classify said battery as good, or good but discharged or bad and unserviceable.

19. A method for determining the condition/classification of automotive and other batteries in accordance with one or more sensed parameters thereof comprising the steps of:

a) applying a transient electrical test parameter to the terminals of a battery to be tested for no more than one second;

b) utilising a characteristic of the battery's reaction to said test parameter as a basis for said determination;

c) said method further comprising the step of utilising the battery's reaction to said transient test parameter to provide a measure of the condition of said battery by analysis of the waveform shape or profile of an electrical value representative of the battery's reaction to said test parameter;

characterised by d) applying at least one further transient electrical test parameter to said battery to be tested for no more than one second;

e) said one and said further transient electrical test parameter forming a microcycle of two or more transient charges and/or loads applied to said battery in sequence; and f) analysing data relating to the battery's reaction to said microcycle by a neural network and/or an algorithm to enable classification of said battery.

20. A method according to claim 19 characterised by said analysis step being effected in relation to one or more of the following characteristics of the battery namely impedance, voltage bounce-back, voltage peaks, voltage troughs, voltage shape or profile, charge take-up, start and end voltages.

21. Apparatus for determining the condition/classification of automotive and other batteries in accordance with one or more sensed parameters thereof comprising:

a) means for applying a transient electrical test parameter to the terminals of a battery to be tested for no more than one second;

b) analysis means adapted to utilise a characteristic of the battery's reaction to said test parameter as a basis for said determination;

c) said analysis means further being adapted to utilise the battery's reaction to said transient test parameter to provide a measure of the condition of said battery by analysis of the waveform shape or profile of an electrical value representative of the battery's reaction to said test parameter;

characterised by d) means for applying at least one further transient electrical test parameter to said battery to be tested for no more than one second;

e) said one and said further transient electrical test parameters forming a microcycle of two or more transient charges and/or loads applied to said battery in sequence; and f) said analysis means being also adapted to analyse data relating to the battery's reaction to said microcycle by a neural network and/or an algorithm to enable classification of said battery.

22. Apparatus according to claim 21 characterised by said analysis means being adapted to effect said analysis steps in relation to one or more of the following characteristics of the battery namely impedeance, voltage bounce-back, voltage peaks, voltage troughs, voltage shape or profile, charge take-up and start and end voltages.

* * * * *